United States Patent [19]

Preisler et al.

[11] Patent Number: 5,362,712
[45] Date of Patent: Nov. 8, 1994

[54] PROCESS FOR REMOVING A COPPER MOLD FROM A MOLDED BODY

[75] Inventors: Eberhard Preisler; Joachim Bock, both of Erftstadt, Germany

[73] Assignee: Hoechst Aktiengesellschaft, Frankfurt am Main

[21] Appl. No.: 81,855

[22] Filed: Jun. 23, 1993

Related U.S. Application Data

[63] Continuation of Ser. No. 741,248, Aug. 2, 1991, abandoned.

[30] Foreign Application Priority Data

Aug. 17, 1990 [DE] Germany ............ 4026015.1

[51] Int. Cl.$^5$ ............ H01L 39/12; C23F 1/00
[52] U.S. Cl. ............ 505/410; 156/656; 156/666; 264/317; 505/450
[58] Field of Search ............ 264/317; 505/1, 739, 505/728, 782, 410, 450; 156/625, 628, 656, 666; 252/79.1, 79.2; 423/658.5

[56] References Cited

U.S. PATENT DOCUMENTS

| | | | |
|---|---|---|---|
| 2,414,226 | 1/1947 | Everett | 264/317 |
| 3,373,113 | 3/1968 | Achenbach | 156/656 |
| 3,429,962 | 2/1969 | Krystyniak | 264/309 |
| 3,429,962 | 2/1969 | Krystyniak | 264/309 |
| 3,939,241 | 2/1976 | Powell et al. | 264/317 |
| 4,025,361 | 5/1977 | Lucas | 134/28 |
| 4,976,808 | 12/1990 | Ogasawara | 156/666 |
| 4,981,553 | 1/1991 | Tygat et al. | 156/666 |
| 5,047,391 | 9/1991 | Bock et al. | 505/1 |
| 5,215,961 | 6/1993 | Rayne et al. | 505/1 |

FOREIGN PATENT DOCUMENTS

| | | | |
|---|---|---|---|
| 2828762 | 1/1980 | Germany . | |
| 3830092 | 3/1990 | Germany . | |
| 0214602 | 12/1984 | Japan | 264/317 |
| 1016807 | 1/1986 | Japan | 264/317 |

*Primary Examiner*—Christopher A. Fiorilla
*Attorney, Agent, or Firm*—Connolly and Hutz

[57] ABSTRACT

In the process for producing molded bodies from precursors of oxidic high-temperature superconductors a copper mold of the desired shape which encloses a solidified bismuth strontium calcium cuprate melt is treated with a solution of a soluble compound containing sulfate anions, an aqueous mineral acid and an oxidizing agent until the copper mold is dissolved. A protective layer of at least one of strontium sulfate or calcium sulfate is formed on the solidified melt.

5 Claims, No Drawings

PROCESS FOR REMOVING A COPPER MOLD FROM A MOLDED BODY

This application is a continuation of application Ser. No. 07/741,248 filed on Aug. 2, 1991, now abandoned.

The melt synthesis of high-temperature superconductor materials based on bismuth strontium calcium cuprate is described in DE 3,830,092 A1. The "BSCCO" high-temperature superconductors which can be prepared according thereto or in another known manner have the composition $Bi_2(Sr,Ca)_3Cu_2O_x$ ("2-layer compound"), the ratio of strontium to calcium being (2 to 5) : 1 (BSCCO stands for bismuth strontium calcium copper oxide). In addition, "1-layer compounds", $Bi_2(Sr,Ca)_2CuO_x$, and "3-layer compounds", $Bi_2(Sr,Ca)_4Cu_3O_x$, are known as BSCCO high-temperature superconductors. The oxygen index "x" is set by the sum of the valencies of Bi, Sr, Ca and Cu, but is variable to the extent that Bi may be tri- or pentavalent and Cu may be mono- or divalent.

DE 3,830,092 A1 also mentions the production of molded bodies from the bismuth strontium calcium cuprates. Such molded bodies can be obtained, for example, by casting in variously shaped molds which are preferably composed of copper if the mold is open as, for example, in the case of a cavity having inclined sidewalls or a half cylinder and permits the removal of the casting in terms of shape. It is also important that the casting is carried out with the mold cold so that the solidifying melt cools so rapidly at the mold wall that a chemical reaction with the copper of the mold wall does not occur. Even if the mold wall is flexible and is composed, for example, of a thin metal sheet which can be bent aside after cooling, there are no problems.

Substantially more difficult is the production of more complicated molded bodies which necessitate a substantially closed mold possibly having a complicated shape. In such cases, even the principle of a rapid cooling to avoid the wall reaction cannot always be used because the mold possibly has to be preheated to avoid an unduly premature solidification of the melt flowing in. In comparatively simple cases, for example in the production of fairly thick cylindrical molded bodies by casting in a tubular mold, a mechanical removal of the casing material is still conceivable, for instance by separating the mold wall into two half shells. However, this is no longer an attractive process even for relatively small diameters and can no longer be used in the case of complicated geometries such as rings or coils.

In order to convert a melt of the composition corresponding to the high-temperature superconductor into the superconducting state after solidification, a subsequent heat treatment of the solidified melt of 6 to 30 hours duration at temperatures around 800° C. in air or oxygen is necessary. However, only one metal is known which is suitable as casing material for BSCCO high-temperature superconductors and is permeable to oxygen at the heat treatment temperatures and, consequently, makes possible the conversion of the solidified melt into the desired high-temperature superconductor inside the metal casing: silver. Unfortunately, at 960.8° C., the melting point of silver is below the temperature at which the superconductor melt has to be in order to be capable of being reliably cast. Thus, a silver mold would melt before the superconductor melt had solidified.

For this reason, it is necessary to resort to copper molds since copper is the only system-immanent metal which is suitable for the present purpose. However, a removal of the copper from the solidified melt is absolutely necessary.

Since the mechanical stripping of the copper mold is only of limited practicability, its chemical dissolution suggests itself. In principle, this is possible with the aid of an oxidizing acid or an acid plus oxidizing agent. Experiments of this type are known in connection with the investigation of yttrium barium cuprate superconductor powders which had been poured into copper tubes and compacted by deep drawing and rolling.

If, however, it is desired to proceed in the same manner in the case of bismuth-based superconductors, a strong attack of the acid on the superconductor or its precursor of the solidified melt is observed as soon as the copper casing is dissolved at one point and the surface of the solidified melt is laid bare. Specifically, it is found that the superconducting bismuth compounds are acid-soluble.

The object of the present invention is to provide a method which makes it possible to dissolve the copper casing without appreciably attacking the underlying superconductor or its precursor.

This object was achieved by adding sulfate ions to the solution containing the oxidizing acid or a nonoxidizing acid and an oxidizing agent. The principle underlying this invention is the formation of a protective layer, which suppresses a further attack of the acid upon the superconducting compound, composed of strontium sulfate and/or calcium sulfate from the sulfate added to the electrolyte and the alkaline earth metals contained in the superconducting compound.

In particular, the invention therefore relates to a process for producing molded bodies from precursors of oxidic high-temperature superconductors of the BSCCO type, which comprises treating a copper mold of the desired shape which encloses a solidified bismuth strontium calcium cuprate melt with a solution of a soluble compound containing sulfate anions, an aqueous mineral acid and an oxidizing agent until the copper mold is dissolved.

In addition, the process of the invention may preferably or optionally be one wherein a) the sulfates of sodium, potassium, ammonium, magnesium or zinc are used as soluble compound containing sulfate anions;

b) hydrochloric acid or phosphoric acid is used as mineral acid;

c) hydrogen peroxide or alkali chlorate is used as oxidizing agent;

d) nitric acid is simultaneously used as aqueous mineral acid and oxidizing agent;

e) sulfuric acid is simultaneously used as aqueous mineral acid and as compound containing sulfate anions;

f) the copper mold is dissolved with a solution of aqueous nitric acid and sodium sulfate;

g) the copper mold is dissolved with a solution of aqueous sulfuric acid and hydrogen peroxide;

h) the treatment is carried out at 15° to 80° C.;

i) a copper mold is treated which encloses the solidified bismuth strontium calcium cuprate melt and has one or more openings.

The amount of the compound containing sulfate anions to be used may be small per se and it is only necessary for the solubility product of calcium sulfate and strontium sulfate to be exceeded in the presence of mineral acid and oxidizing agent and at the selected temperature. Even 2 g of soluble sulfate compound, for example $Na_2SO_4$, per liter of solution clearly exhibit the desired effects, but preferably concentrations of 100 to 300 g of soluble sulfate compound per liter of solution are employed.

The acid concentration, the treatment temperature and the treatment time are not crucial. In general, low acid concentration and low treatment temperature require a longer treatment time and vice versa. In other respects, the treatment time depends decisively on the thickness of the mold wall to be dissolved.

For example, 10 to 32% by weight $HNO_3$, 10 to 20% by weight HCl or 10 to 35% by weight $H_2SO_4$ can be employed, but without being tied to these limits. The concentration of the oxidizing agent, for example of the hydrogen peroxide, plays a role to an equally small extent. It is only necessary to ensure that $H_2O_2$ is also constantly present in addition to the nonoxidizing mineral acid. $H_2O_2$, must therefore be gradually added, if necessary, in several portions.

It is, of course, within the scope of this invention if, in the case of somewhat thicker copper mold walls (for instance, above 0.5 mm), a larger proportion of the copper is dissolved, for example, in pure nitric acid and, if necessary, also at elevated temperature, but in the absence of sulfate ions and only then, when there is a danger of a local breakthrough of the superconductor surface, is a changeover made to the process according to the invention. In the absence of sulfate ions, the open end walls may be sealed, for example, with wax and thus be protected against the attack of the nitric acid. In this manner pure copper nitrate solutions are obtained which are not contaminated by sulfate. In addition, the copper mold is in total dissolved in a shorter time.

The process according to the invention is described in more detail below with reference to the embodiment using nitric acid:

The attack of nitric acid on the solidified superconductor melt depends, for a given nitric acid concentration and at room temperature, on the concentration of sulfate ions in the solution. Table 1 shows the losses in weight (in % of the initial weight) for a compact cylindrical test piece having a length of 14 mm and a diameter of 7mm (surface: $3.86\ cm^2$), with the etching solution containing 10% by weight of nitric acid and 0 to 500 g.l$^{-1}$ sodium sulfate. The experiment was carried out at room temperature.

TABLE 1

Inhibitory action of sodium sulfate additions on the dissolution of BSCCO 2212 ($Bi_2Sr_2CaCu_2O_x$) in nitric acid (10%)

| No. | $Na_2SO_4$ (anhydrous) g·l$^{-1}$ | Weight loss (%) after | | | | | | |
|---|---|---|---|---|---|---|---|---|
| | | 5' | 15' | 30' | 1 h | 2 h | 4 h | 8 h |
| 1 | 0 | 3.2 | 9.6 | 18.9 | 30.4 | 43.7 | 68.1 | n.d. |
| 2 | 100 | 0.1 | 0.15 | 0.23 | 0.32 | 0.39 | 0.50 | 0.65 |
| 3 | 200 | 0 | 0 | 0.02 | 0.15 | 0.32 | 0.76 | 1.42 |
| 4 | 300 | 0 | 0 | 0.04 | 0.12 | 0.26 | 0.45 | 0.90 |
| 5 | 400 | 0 | 0 | 0 | 0 | 0 | 0.04 | 0.16 |
| 6 | 500 | 0 | 0 | 0 | 0 | 0 | 0.03 | 0.08 | n.d. = not determined

Adding sodium sulfate to 10% nitric acid does, however, also reduce the rate of dissolution of the copper:

TABLE 2

Dissolution of an empty copper tube piece having a comparable surface to that of BSCCO 2212 in Table 1 at various sodium sulfate concentrations

| No. | $Na_2SO_4$ (anhydrous) g·l$^{-1}$ | Weight loss (%) after | | |
|---|---|---|---|---|
| | | 30' | 2 h | 8 h |
| 1 | 0 | 0.3 | 3.8 | 11 |
| 2 | 100 | 0.1 | 0.6 | 3.3 |
| 3 | 200 | 0.04 | 0.26 | 1.7 |
| 4 | 300 | 0 | 0 | 0 |

With 10% nitric acid and 100 g of sodium sulfate, a substantial protection of the BSCCO core is already achieved, but the rates of dissolution of the copper are still very low for technical purposes. If 20% nitric acid is used, the conditions which are shown in Table 3 both for the dissolution of BSCCO and for that of copper (in brackets) are more favorable.

TABLE 3

Inhibitory action of sodium sulfate on the dissolution of BSCCO 2212 and copper (. . .) in 20% nitric acid at room temperature

| No. | $Na_2SO_4$ (anhydrous) g·l$^{-1}$ | Loss in weight (%) after | | | | | |
|---|---|---|---|---|---|---|---|
| | | 15' | 30' | 1 h | 2 h | 4 h | 8 h |
| 1 | 0 | 25(18) | 44(34) | 72(60) | 100(100) | 100(100) | 100(100) |
| 2 | 100 | 1.7(12) | 2(23) | 2.3(42) | 2.5(87) | 2.7(100) | 3.0(100) |
| 3 | 200 | 0.2(9) | 0.2(18) | 0.4(35) | 0.7(74) | 0.9(100) | 1.3(100) |
| 4 | 300 | 0(6) | 0(13) | 0(25) | 0(52) | 0.2(79) | 0.2(100) |
| 5 | 400 | 0(4) | 0(9) | 0(17) | 0(31) | 0(40) | 0.2(52) |
| 6 | 500 | 0(2) | 0(4) | 0(7) | 0(9) | 0(12) | 0(18) |

The dissolution in 32% nitric acid at room temperature is shown in Table 4 (with the values for copper again in brackets):

TABLE 4

Inhibitory action of sodium sulfate on the dissolution of BSCCO 2212 and copper (. . .) in 32% nitric acid at room temperature

| No. | $Na_2SO_4$ (anhydrous) g·l$^{-1}$ | Loss in weight (%) after | | | | |
|---|---|---|---|---|---|---|
| | | 15' | 30' | 1 h | 2 h | 4 h |
| 1 | 100 | 0.51(71) | 1.7(100) | 4.4(100) | 9(100) | 20(100) |
| 2 | <200+ | 0.13(38) | 0(45) | 0.12(59) | 3(70) | 9(87) |

+200 g of $Na_2SO_4$ are no longer completely soluble in 32% $HNO_3$.

These experiments show that a combination of 20% nitric acid with 200 to 300 g of sodium sulfate are a sort of optimum with which a still usable rate of dissolution is accompanied by a good protective action. Of course, with continuous visual inspection, 32% nitric acid with 100 g of sodium sulfate is also suitable. However, copper dissolves much more slowly in a solution saturated with sodium sulfate because, with increasing dissolution of the copper, copper sulfate also crystallizes out immediately and readily deposits on the copper surface, inhibiting or rendering uneven the further dissolution.

Elevated temperature

The effect of elevated temperature was examined in 10% nitric acid:

TABLE 5

Inhibitory action of $Na_2SO_4$ on the dissolution of BSCCO 2212 and copper in 10% nitric acid at 70° C. (values for copper in brackets)

| No. | $Na_2SO_4$ (anhydrous) $g \cdot l^{-1}$ | Loss in weight (%) after | | | | | |
|---|---|---|---|---|---|---|---|
| | | 15' | 30' | 1 h | 2 h | 4 h | 8 h |
| 1 | 100 | 0.45(17) | 0.77(32) | 1.1(59) | 1.4(100) | 2.1(100) | 2.9(100) |
| 2 | 300 | 0(3) | 0.16(7) | 0.22(14) | 0.5(27) | 0.7(58) | 0.7(92) |
| 3 | 500 | 0(0) | 0(0) | 0(0) | — | — | — |

Here again favorable results are obtained with 100 to 300 g of sodium sulfate in a liter. They are essentially equivalent to those which are obtained at room temperature with 20% nitric acid.

In principle, other solutions which have the same effect as nitric acid are also conceivable:
a) Sulfuric acid + hydrogen peroxide
b) Hydrochloric acid + hydrogen peroxide
c) Hydrochloric acid + alkali chlorate The suitability of the combination of sulfuric acid with an oxidizing agent is demonstrated using 20% sulfuric acid with 10% hydrogen peroxide at room temperature. In this case, the addition of a sulfate is not necessary since the sulfate anions needed are provided by the sulfuric acid itself.

TABLE 6

Differences in the dissolution of BSCCO 2212 and copper in 20% sulfuric acid with 10% $H_2O_2$ added at room temperature

| Time: | 5' | 15' | 1 h | 2 h | 4 h |
|---|---|---|---|---|---|
| Loss in weight of Cu/% | 9.8 | 18 | 51 | 76 | 100 |
| Loss in weight of BSCCO/% | 0.2 | 0.4 | 0.55 | 0.75 | 1.02 |

EXAMPLE

Comparative Example

A copper tube having a length of 10 cm, a wall thickness of 1 mm and an internal width of 8 mm which contains a core composed of a solidified BSOCO high-temperature superconductor melt of the formula $Bi_2Sr_2CaCu_2O_x$, is placed in 20% nitric acid at room temperature and left there while stirring until the copper casing has been partially etched away (2.8 h) and a part of the core is exposed. The surface of the core exhibits deep holes and at the end faces, where the core was exposed to the action of the nitric acid without protection, it is dissolved away over a width of several mm.

EXAMPLE 2

Example 1 was repeated, but 300 g of sodium sulfate were dissolved in one liter of 20% nitric acid. After 3 hours no breakthrough of the core was as yet observable and a dense white film which covered the original surface had formed at the exposed end faces. After 12 hours, the copper had been dissolved down and the entire core was then covered with the white thin covering layer. Signs of an uneven removal or pitting were not observed.

EXAMPLE 3

A similar rod to that in Example 1 was brought into contact with 200 ml of 20% sulfuric acid to which 30 ml of 10% by weight hydrogen peroxide, divided into three equal portions, was gradually added, in which process copper was dissolved. The solution was stirred by means of a magnetic stirrer and the temperature was 25° C. After 15 hours of contact tee the copper casing had been dissolved. The superconductor core exhibited no acid attack on its surface, which was uniformly covered with alkaline earth metal sulfate.

We claim:

1. A process for removing a copper mold from a molded high-temperature superconductor precursor body which comprises treating a copper mold which encloses a molded body of solidified bismuth strontium calcium cuprate melt with a solution of (a) a compound containing sulfate anions, (b) an aqueous mineral acid and (c) an oxidizing agent, to dissolve the copper mold and to form a protective layer of at least one of strontium sulfate or calcium sulfate on said molded body from the sulfate anions and strontium and calcium contained in the solidified melt, said protective layer suppressing an attack of the mineral acid upon said molded body, wherein (1) said compound containing sulfate anions is a sulfate of sodium, potassium, ammonium, magnesium or zinc; and
   (2) either hydrochloric or phosphoric acid is used as said mineral acid in combination with said compound containing sulfate anions and said oxidizing agent, or nitric acid is simultaneously used as said mineral acid and said oxidizing agent in combination with said compound containing sulfate anions.

2. A process as claimed in claim 1, wherein hydrogen peroxide or alkali chlorate is used as said oxidizing agent.

3. A process as claimed in claim 1, wherein the copper mold is dissolved with a solution of aqueous nitric acid and sodium sulfate.

4. A process as claimed in claim 1, wherein the treatment is carried out at 15° to 80° C.

5. A process as claimed in claim 1, wherein said copper mold has one or more openings and encloses the solidified bismuth strontium calcium cuprate melt.

* * * * *